United States Patent
Chen

(10) Patent No.: US 6,902,982 B2
(45) Date of Patent: Jun. 7, 2005

(54) TRENCH CAPACITOR AND PROCESS FOR PREVENTING PARASITIC LEAKAGE

(75) Inventor: Shih-Fang Chen, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/681,125

(22) Filed: Oct. 9, 2003

(65) Prior Publication Data

US 2004/0209436 A1 Oct. 21, 2004

Related U.S. Application Data

(63) Continuation-in-part of application No. 10/404,430, filed on Apr. 2, 2003, now abandoned.

(51) Int. Cl.[7] ............................................... H01L 21/20
(52) U.S. Cl. ..................... 438/392; 438/243; 438/247; 438/249; 438/386
(58) Field of Search ........................... 257/68, 71, 301, 257/304, 305, 905; 438/243–247, 249, 386, 387, 389, 390, 392

(56) References Cited

U.S. PATENT DOCUMENTS

| | | | | | |
|---|---|---|---|---|---|
| 4,782,036 A | * | 11/1988 | Becker et al. | ............... | 438/561 |
| 6,163,045 A | * | 12/2000 | Mandelman et al. | ....... | 257/301 |
| 6,265,279 B1 | * | 7/2001 | Radens et al. | ............... | 438/386 |

FOREIGN PATENT DOCUMENTS

TW          402807          8/2000

* cited by examiner

*Primary Examiner*—Asok Kumar Sarkar
(74) *Attorney, Agent, or Firm*—Birch, Stewart, Kolasch & Birch, LLP

(57) ABSTRACT

A trench capacitor process for preventing parasitic leakage. The process is capable of blocking leakage current from a parasitic transistor adjacent to the trench, and includes the steps of forming a doping layer and a cap layer covering portions of the sidewall of the trench and performing an annealing process on the doping layer to form a dopant region in the substrate adjacent to each sidewall of the trench and blocks leakage current from a parasitic transistor adjacent to the trench.

21 Claims, 6 Drawing Sheets

TRENCH CAPACITOR AND PROCESS FOR PREVENTING PARASITIC LEAKAGE

CROSS-REFERENCE TO RELATED APPLICATION

This application is a continuation-in-part (CIP) of U.S. application Ser. No. 10/404,430 filed on Apr. 2, 2003, which is hereby incorporated by reference now abandoned.

BACKGROUND OF THE INVENTION

1. Field of the Invention

The present invention relates to a semiconductor device and the process thereof and in particular to a trench capacitor process for preventing parasitic leakage adjacent to trench capacitors in DRAM cells.

2. Description of the Related Art

Dynamic random access memory (DRAM), a kind of semiconductor memory, consists of a storage capacitor and an access transistor in each cell enables higher integration, and is widely used in computers and electronic devices.

Nevertheless, charge stored in a capacitor decreases over time, resulting from an inherent leakage current, so DRAM cells must be refreshed before the stored charge falls below the operational threshold voltage ($V_{th}$).

A trench capacitor is a typical structure used in DRAM cells, and storage capacity thereof can be increased through enlarging the depth of the trench and providing a larger surface area.

In FIG. 1, a layout is shown for conventional trench capacitors. Trench capacitors 10 are disposed under passing wordlines 12. Access transistors 14 are electrically coupled to storage nodes 16 of trench capacitors 10 through diffusion regions 18. Diffusion regions 20 are also included, being electrically connected to contacts 22. The contacts 22 connect to a bitline (not shown) to read and write to storage nodes 16 through access transistors 14. Access transistors 14 are activated by wordlines 12. When voltage is applied to wordlines 12, a channel therebelow allows current between diffusion regions 18 and 20 and into or out of storage nodes 16.

In FIG. 2, a cross-section along the A–A' phantom line in FIG. 1 is shown to illustrate a conventional trench capacitor employed in n-channel MOSFET. At this point, a trench capacitor 10 is formed in a substrate 24 and the trench is typically filled with polysilicon to form a storage node 16 doped with n-type dopants. A buried plate 26 is also doped with n-type dopants and surrounds the lower portion of the trench. A node dielectric 28 separates the storage node 16 and the buried plate 26. The storage node 16 and a P-well PW, including p-dopants are electrically isolated by the dielectric collars 30. The buried well 32, including n-type dopants, is provided to connect the buried plate 26 adjacent to the trench capacitor 10.

The diffusion region 18 of the access transistor 14 is connected to the storage node 16 by a node diffusion region 34. When the trench capacitor 10 is completely formed, a shallow trench isolation (STI) 38 is then formed in the substrate and part of the trench capacitor 10 to define an active area and to isolate the trench capacitor 10 and a passing wordline 12' formed later. Wordlines 12 and the STI 38 can then be used as implant masks forming diffusion regions 18 and 20 which may be a source and drain of the access transistor 14.

During the operation of the trench capacitor 10, a vertical parasitic transistor will typically be formed on the sidewall of the trench in the region 40 of FIG. 2, located in the p-well PW between the node diffusion region 34 and the buried plate 24.

The region 40 in FIG. 2 is further enlarged and rotated 90° counterclockwise in FIG. 3 for illustration. At this point, the above-mentioned parasitic transistor includes the node diffusion region 34 and the buried well 32 as its source and drain (respectively). When an appropriate charge is stored within the capacitor, the storage node 16 acts as a gate and the dielectric collar 30 acts as a gate dielectric, and then a channel 42 will be formed in the p-well PW within the substrate and charges stored in a trench capacitor can pass through this channel 42 and form a parasitic leakage current, resulting in increased frequency to refresh the storage capacitor and affect charge storage performance.

SUMMARY OF THE INVENTION

Accordingly, an object of the invention is to provide a trench capacitor process to reduce the parasitic leakage adjacent to a trench capacitor.

Furthermore, the present invention provides a trench capacitor process for preventing parasitic leakage. The process comprises the steps of providing a substrate with a trench formed therein, wherein the trench has a buried plate formed adjacent to the lower portion thereof. A dielectric layer and a first conductive layer are formed in the lower portion of the trench, wherein the buried plate and the first conductive layer are separated by the dielectric layer. A doping layer is forming on portions of each sidewall of the trench exposed by the dielectric layer and the first conductive layer to reveal portions of sidewalls of the trench in the upper portion. A cap layer is formed on each exposed sidewall and each doping layer. An annealing process is performed on each doping layer to form a dopant region in the adjacent substrate, wherein each dopant region blocks leakage current resulting from a parasitic transistor adjacent to the trench and a first distance from the surface of the substrate. A second conductive layer is formed in the trench to expose portions of the cap layers, wherein the second conductive layer contacts the first conductive layer and has substantially the same height with respect to the dopant regions. The cap layers exposed by the second conductive layer are removed to reveal portions of the sidewalls in the upper portion of the trench and a third conductive layer is formed on the second conductive layer to fill the trench, wherein the third conductive layer directly contacts the exposed sidewalls in the upper portions of the trench.

In brief, the present invention provides a trench capacitor process for preventing parasitic leakage, capable of blocking leakage current resulting from a parasitic transistor formed adjacent to the trench. The process comprises the step of forming a doping layer and a cap layer covering part of the sidewall of the trench; and performing an annealing process on the doping layer and forming a dopant region in the substrate adjacent to the sidewall of the trench to block leakage current resulting from a parasitic transistor adjacent to the trench.

In the process for preventing parasitic leakage in accordance with the present invention, the material of the doping layer can be BSG and the material of the cap layer can be silicon dioxide. Using an annealing process such as furnace annealing or rapid thermal annealing (RTA), the dopants (Boron) in the doping layer are driven into the substrate adjacent to the trench capacitor and doping regions vertically distributed in the substrate adjacent to the trench and approximately equidistant from the trench are formed. The charging conductivity of the dopants in these doping regions is the same as in the substrate and the concentration of the dopants in the doping region is about double that in the substrate. The threshold voltage of a parasitic transistor near the dopant region is thus elevated and the parasitic leakage path controlled by the parasitic transistor is not easily turned on. The leakage associated with the vertical parasitic device is suppressed by the dopant region of the invention. The retention time of a trench capacitor is increased, the frequency for refreshing DRAM cells is reduced, and the storage performance of a trench capacitor is enhanced.

Moreover, the dopant region formed adjacent to portions of each sidewall can be adjusted and has a distance about 500~2500 Å from the surface of the substrate. Thus the substrate region therebetween is not additionally doped and the implant dosage and implant time for overcoming the previously formed P-type dopants therein can both be reduced during the processes for forming the source and drain regions such as the source/drain implant processes. Thus, bombardment effects on the substrate surfaces can be reduced and the overall reliability of the formed trench capacitor can be improved.

In addition, the dielectric collar in the art can be replaced by the doping layer and the cap layer formed on the sidewall of the trench in the invention and the sequence of the trench capacitor process need not be changed.

Furthermore, the methods in the invention are widely used in the semiconductor industry so there is no need for retooling. Thus, the trench capacitor process of the invention can be slightly modified from the existing process and adopted quickly to reduce parasitic leakage in trench capacitors, such that the overall performance of the DRAM cells is improved.

In addition, a trench capacitor with a adjacent parasitic leakage channel in accordance with the invention comprises a node diffusion and a buried well in the substrate adjacent to a trench capacitor as a source or drain region. A dual-layered dielectric layer is disposed on a sidewall of the trench capacitor as a gate dielectric and electrically contacts the node diffusion and the buried well. A conductive layer is disposed on the dielectric layer to form a parasitic transistor adjacent to the trench capacitor. A parasitic leakage channel of the parasitic transistor is disposed in the substrate between the node diffusion and the buried well and a dopant region is disposed in the substrate between the node diffusion and the buried well to elevate a threshold voltage for turning on the parasitic leakage channel.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The process of fabricating a trench capacitor for preventing parasitic leakage in accordance with the present invention is illustrated through FIGS. 4 to 10.

Figure 4:
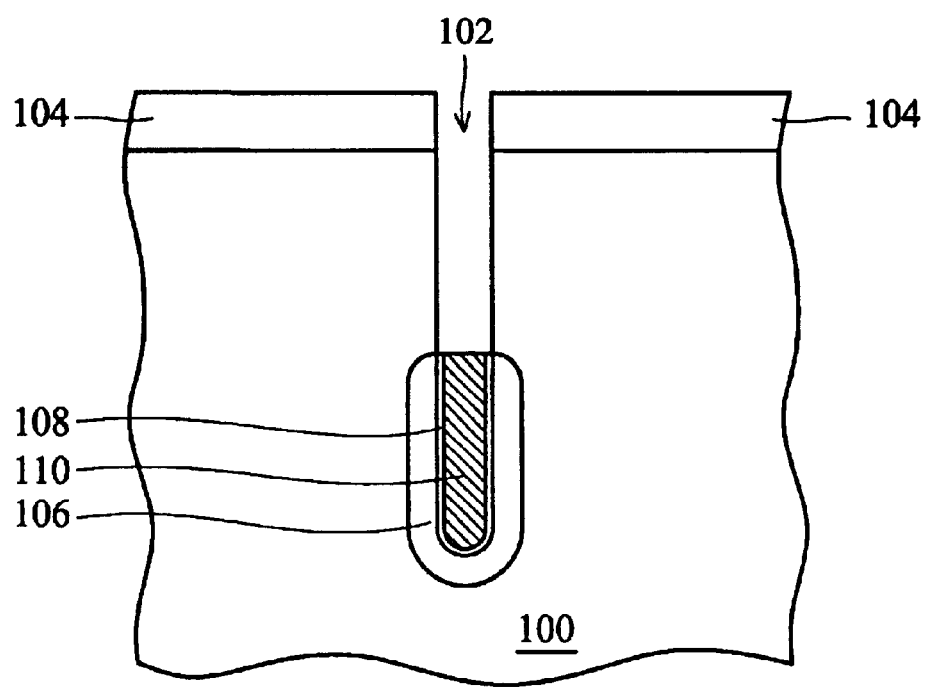
FIGS. 4–9 are cross-sections of a trench capacitor process of the invention.

In FIG. 4, a substrate 100 with a trench 102 formed therein is provided and a pad stack 104 is further formed thereon. The substrate 100 illustratively includes a p-substrate; however n-substrates may be used with appropriate charging conductivities.

The pad stack 104 may include one or more layers of dielectric material, such as silicon dioxide or silicon nitride. The pad stack 104 is opened at the location where the trench 102 is to be placed. The trench 102 is formed by etching the substrate 100 through the pad stack 104. The trench 102 is preferably formed using a reactive ion etching (RIE) process. A buried plate 106 resulting from an n-doped region is formed in the lower portion of the trench 102 by known methods.

A conformal layer of dielectric material is then deposited in the trench 102. The dielectric material preferably includes a nitride, such as silicon nitride. The trench 102 is then filled with a conductive material and then the conductive material is partially removed by a recess process (not shown) and a first conductive layer 110 is formed in the lower portion of the trench 102. The dielectric material exposed by the first conductive layer 110 is then removed and a dielectric layer 108 is formed to separate the buried plate 106 and the first conductive layer 110. The first conductive layer 110 is preferably n-doped polysilicon and more preferably arsenic-doped polysilicon. The processes (not shown) for removing the conductive material and the exposed dielectric material are preferably dry etching and wet etching, respectively.

Figure 5:
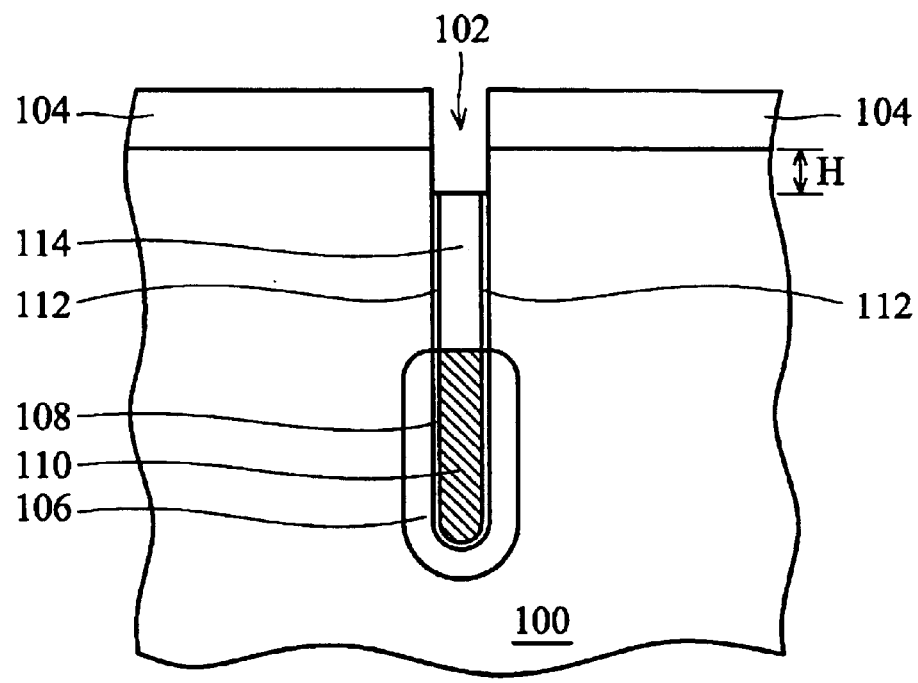

In FIG. 5, a layer of doping material, such as borosilicate-glass (BSG), is conformably deposited on the surface of the pad stack 104 and in the trench 102 through plasma enhanced chemical vapor deposition (PECVD). An etch-back process (not shown) is then performed to remove portions of the doping material on the pad stack 104 and the surface of the first conductive layer 110 and a doping layer 112 covering portions of the sidewalls of the trench 102 exposed by the dielectric layer 108 and the first conductive layer 110 is formed. A protective plug 114 is then formed in the trench 102 by sequentially depositing and recessing a blanket protective material such as photoresist (PR) material on the pad stack 104 and in the trench 102. Portions of the doping layers 112 with a first distance H from the surface of the substrate 100 are thus exposed by the protective plug 114 and then removed through a proper etching step (not shown), for example wet etching, to expose portions of the sidewalls in the upper portion. The first distance H is about 500~2500 Å from the surface of the substrate 100.

Figure 6:
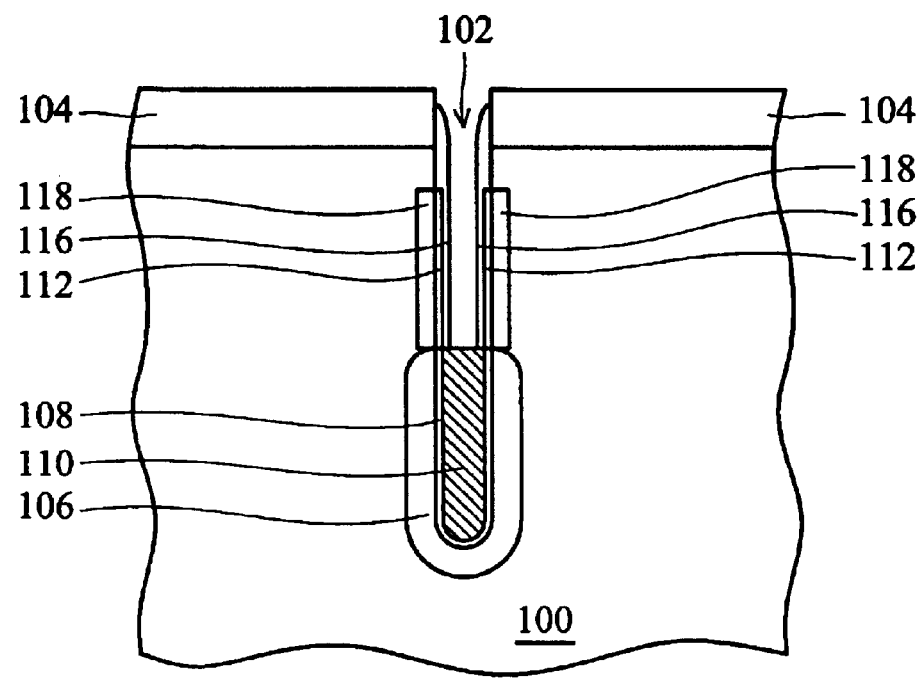

In FIG. 6, after the removal of the protective plug 114, a layer of insulating material, for example silicon dioxide, is conformably formed on the pad stack 104 and in the trench 102 and then etched through an etching step (not shown), for example a plasma dry etching process, to leave a cap layer 116 on each sidewall of the trench 102 and cover the exposed sidewall and the adjacent doping layer 112 thereof. The cap layer 116 is preferably formed by low pressure chemical vapor deposition (LPCVD).

A high temperature annealing process (not shown) applied on the doping layer 112 is then performed and dopants such as boron (B) in the doping layer 112 are sealed by the cap layer 116 and diffuse only toward the substrate 100 on both sides of the trench 102 and dopant regions 118 are thus respectively formed in the substrate 100 adjacent to each sidewall of the trench 102. Thus, the dopant regions 118 are apart from the surface of the substrate 100 and do not contact the substrate surface.

The high temperature annealing process can be furnace annealing or rapid thermal annealing (RTA) and the dopant regions 118 are vertically distributed in the adjacent substrate 100 and approximately equidistant from the trench 102. Through the above-mentioned annealing process, the concentration of the p-type dopants in doping regions 118 can be increased to a concentration of $4 \times 10^{13}$ atoms/cm$^2$ and is about double that in the substrate 100 (typically about $2 \times 10^{13}$ atoms/cm$^2$).

Figure 7:
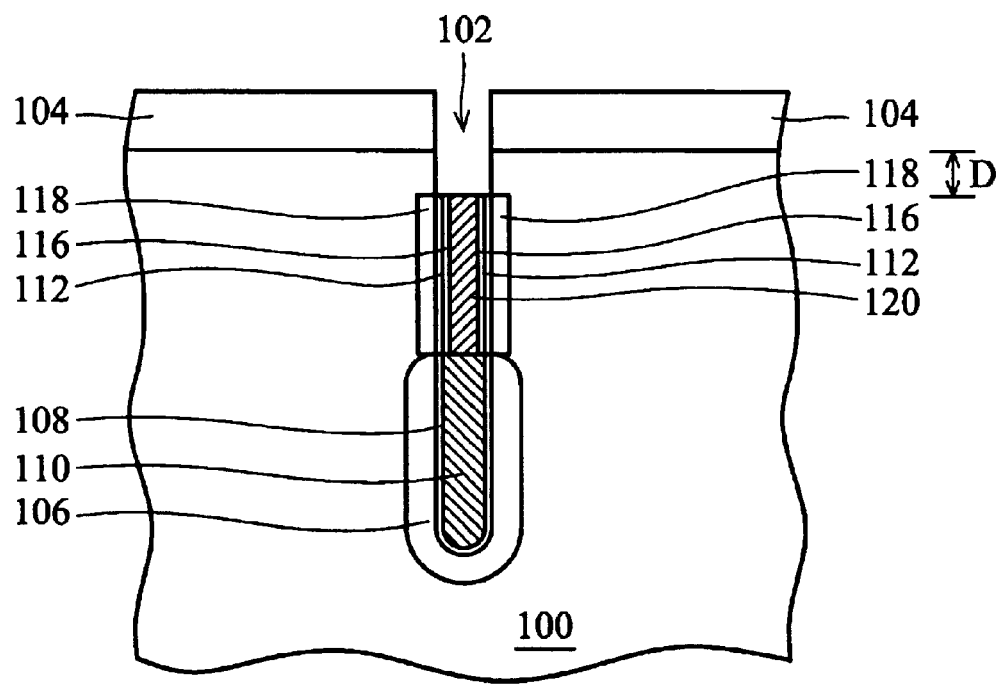

In FIG. 7, the trench 102 is then filled with a subsequent conductive material and the conductive material is etched back by known methods. A recess R with a depth D below the surface of the substrate 100 and a second conductive layer 120 contacting the first conductive layer 110 are thus formed in the trench 102. In the recess R, the second conductive layer 120 has substantially the same height with respect to the adjacent dopant regions 118 and portions of the cap layers 116 in the upper portion of the trench 102 are thus exposed by the second conductive layer 120 and then removed through a proper etching step such as wet etching and adjacent sidewalls thereof are thus exposed. The depth D of the recess R is about 500~2500 Å from the surface of the substrate 100.

Figure 8:
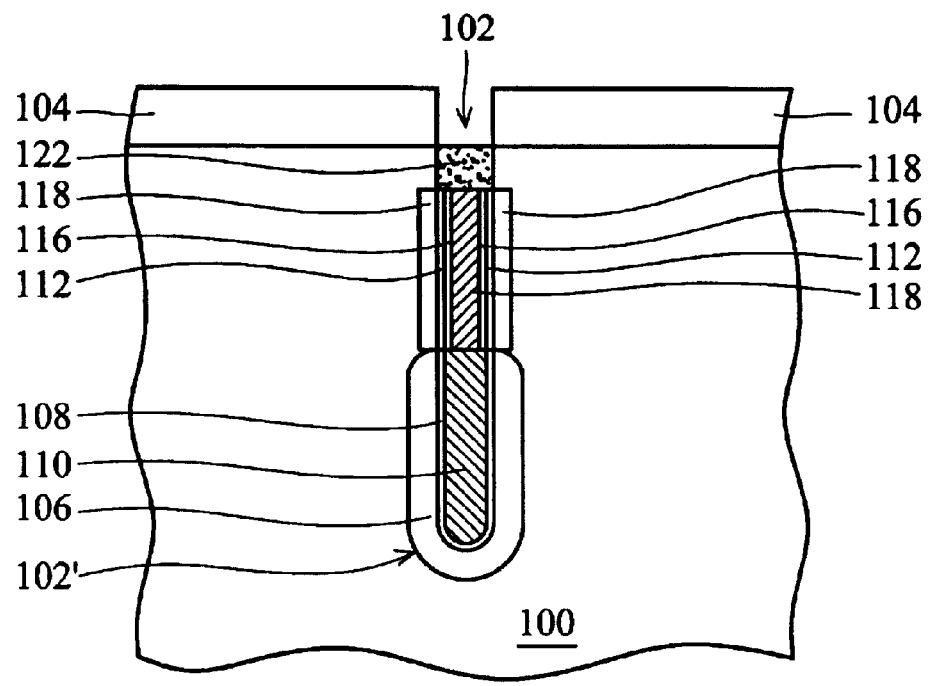

In FIG. 8, the trench 102 is then re-filled with a conductive material to form a third conductive layer 122 that fills the trench 102 and contacts the second conductive layer 120 and the trench 102 directly by a conventional recess process (not shown). The surface of the third conductive layer is about the same height as the surface of substrate 100. The second conductive layer 120 and the third conductive layer 122 are preferably n-doped polysilicon and, more preferably, arsenic-doped polysilicon.

Here, a charge storage node consisting of the first, second and third conductive layer is formed. A trench capacitor 102' is then formed by matching the storage node with the dielectric layer 108, the buried plate 106 and the cap layer 116. The composite film of the doping layer 112 and the cap layer 116 in the invention can also perform electrical isolation between a storage node and the p-well, thus replacing the dielectric collar in the prior art.

Figure 9:
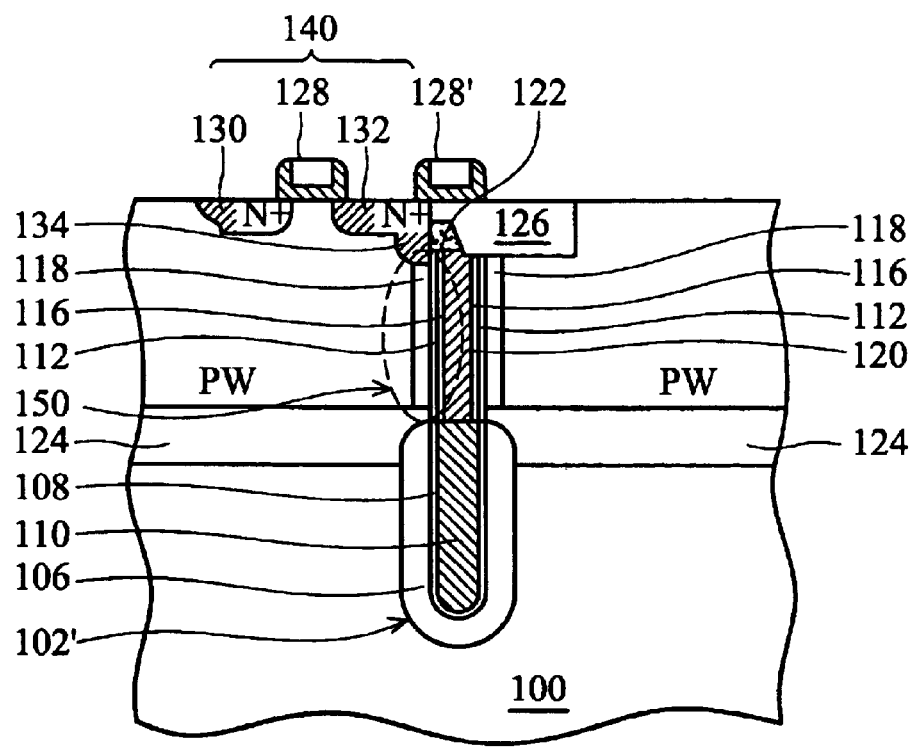

In FIG. 9, the buried well 124 comprising n-type dopants is then formed in substrate 100 outside the trench capacitor 102' by known methods, connecting the buried plate 106 adjacent to the trench capacitor 102'. A shallow trench isolation (STI) 126 is then formed in the substrate and part of the trench capacitor 102' to define an active area and to isolate the trench capacitor 102' from the passing wordline 128' formed later, thus combining with the wordline 128 and the passing wordline 128' to act as implant masks for forming diffusion regions 130 and 132, which may be a source and drain of the access transistor 140. The diffusion region 132 of the access transistor 140 is connected to a storage node (as shown a third conductive layer 122 here) by the node diffusion region 132. A DRAM cell consisting of a trench capacitor 102' and an access transistor 140 is then completely formed.

Figure 1:
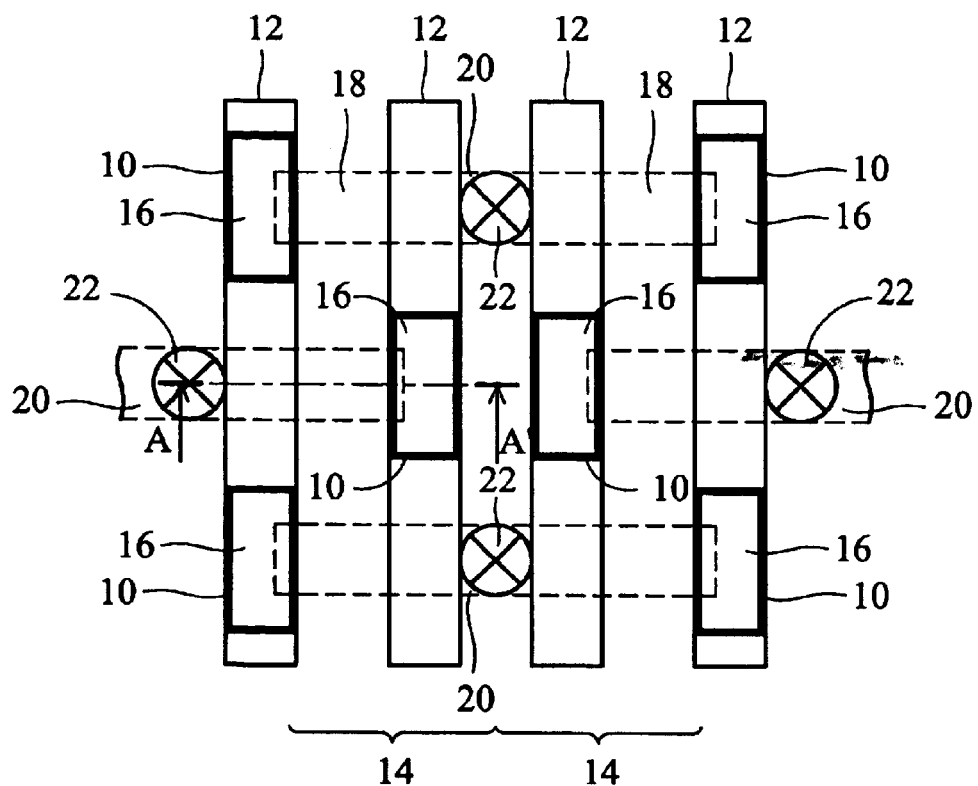
FIG. 1 is a layout of conventional trench capacitors in the prior art.
Figure 2:
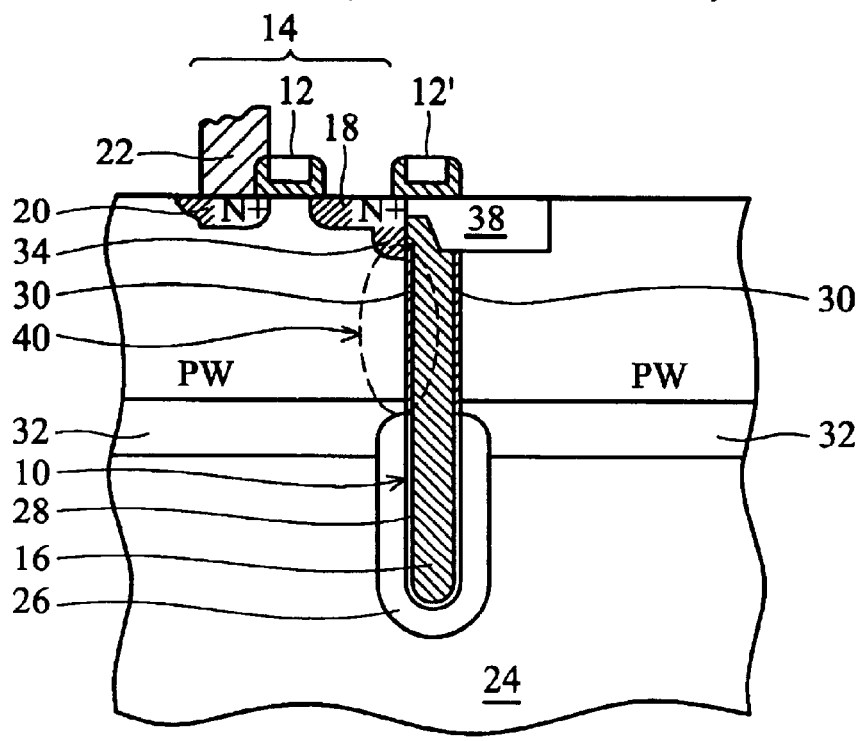
FIG. 2 is a cross-section along the A–A' phantom line in FIG. 1.
Figure 3:
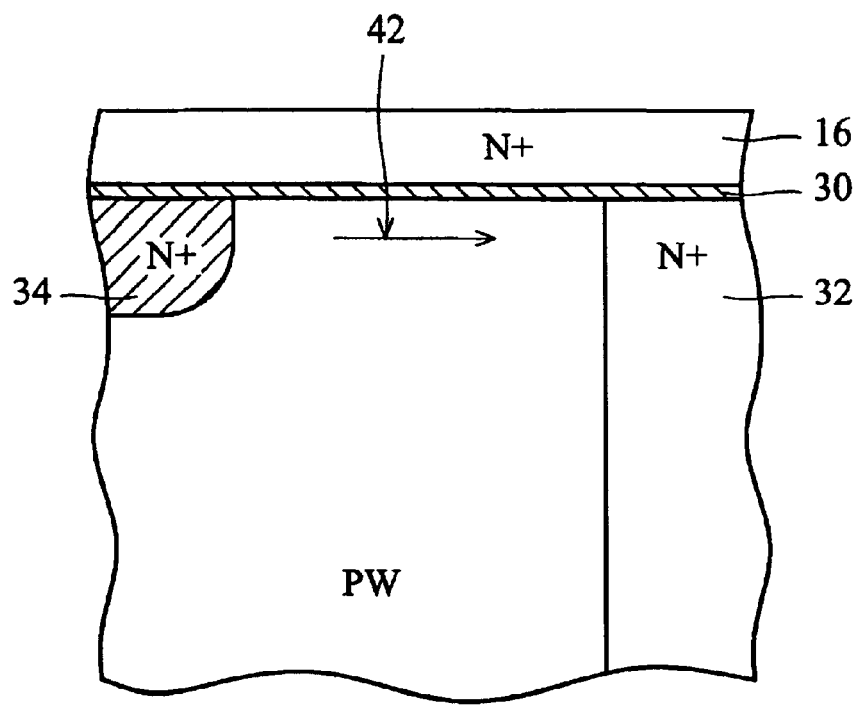
FIG. 3 is an enlarged view of region 40 in FIG. 2.
Figure 10:
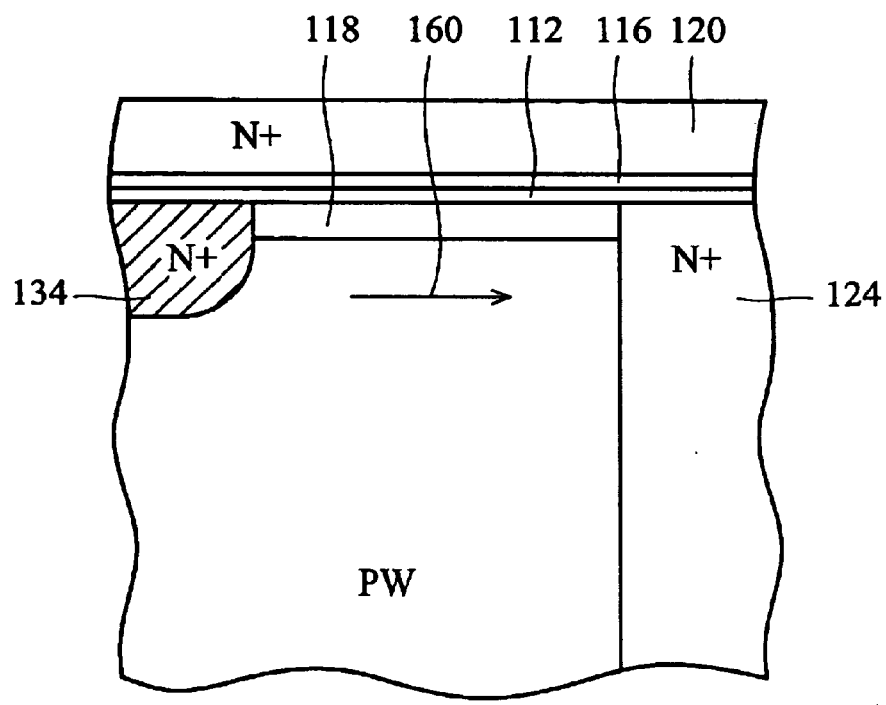
FIG. 10 is an enlarged view of region 150 in FIG. 9.

The region 150 in FIG. 9 is further enlarged and rotated 90° counterclockwise in FIG. 10 for illustration. At this point, the above-mentioned parasitic transistor includes the node diffusion 134 and the buried well 124 as its source and drain (respectively). The storage node (shown as the second conductive layer 120 here) acts as a gate and the doping layer 112 and the cap layer 116 act as a dual-layered gate dielectric. Through the trench capacitor process in accordance with present invention, a dopant region 118 with the same charging conductivity as the p-well PW is formed, a higher threshold voltage ($V_{th}$) is required to turn on the channel 160 than to turn on the channel 42 in FIG. 3 where no dopant region exists.

Figure 11:
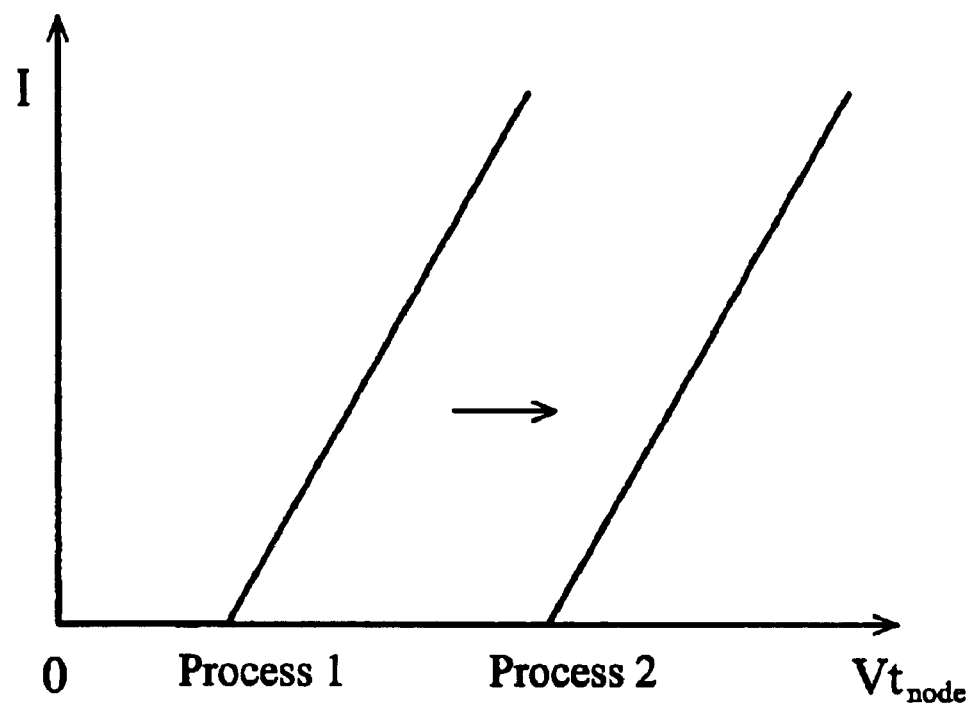
FIG. 11 is a comparison between leakage current reduction in a parasitic transistor of the invention and in the prior art.

In FIG. 11, a comparison of leakage current (I) reduction of a parasitic transistor in the invention and in the prior art is shown. The threshold voltage for turning on a parasitic transistor is referred to hereinafter as $Vt_{node}$. By comparing the conventional trench capacitor formed in the art (shown as process 1) with the trench capacitor formed in accordance with the present invention (shown as process 2), the $Vt_{node}$ in process 2 is elevated, making the channel 160 in FIG. 11 more difficult to turn on, so the charges stored in a trench capacitor achieve better performance, the retention time of the trench capacitor is enhanced, and DRAM refresh frequency can be reduced, such that the storage performance of trench capacitors is enhanced.

Compared with the prior art, the present invention has the following advantages.

First, in the dopant regions formed adjacent to portions of sidewalls of a trench capacitor in accordance with the prevent invention, the concentration of the p-dopants is double that in the substrate, so the threshold voltage of a parasitic transistor near this region is elevated and the parasitic leakage path controlled by the parasitic transistor is not easily turned on. The leakage current associated with the vertical parasitic device is suppressed by the dopant region in the invention. The retention time of a trench capacitor is elevated, the DRAM refresh frequency is reduced, and the storage performance of a trench capacitor is enhanced.

Second, the dielectric collar in the art can be replaced by the doping layer and the cap layer formed on the sidewall of the trench in the invention and the sequence of the trench capacitor process need not be changed.

Third, the dopant region formed adjacent to portions of each sidewall can be adjusted and has a distance about 500~2500 Å from the surface of the substrate. Thus the substrate region therebetween is not additionally doped and the implant dosage and implant times for overcoming the previous formed P-type dopants therein can both be reduced during the processes for forming the source and drain regions such as the source/drain implant processes. Thus, possible bombardment effects to the substrate surfaces are reduced and the overall reliability of the formed trench capacitor is also improved.

Fourth, the manufacturing methods in the invention are widely used in the semiconductor industry such that there is no need for retooling. Thus, the trench capacitor process of the invention can be slightly modified from the existing process and adopted quickly and easily to reduce the parasitic leakage in trench capacitors and the overall performance of the DRAM cells is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A trench capacitor process for preventing parasitic leakage, comprising the steps of:

providing a substrate with a trench formed therein, wherein the trench has a buried plate formed adjacent to the lower portion thereof;

forming a dielectric layer and a first conductive layer in the lower portion of the trench, wherein the buried plate and the first conductive layer are separated by the dielectric layer;

conformably depositing a layer of doping material on the substrate, the sidewalls in the upper portion of the trench and the dielectric layer and the first conductive layer in the lower portion of the trench;

removing the portion of the doping material on the substrate and the dielectric layer and the first conductive layer in the lower portion of the trench to leave a doping layer on sidewalls of the trench;

forming a protective plug in the trench to expose a portion of the doping layer; removing the portion of the doping layer exposed by the protective plug;

removing the protective plug to form a doping layer on portions of each sidewall of the trench above the dielectric layer and the first conductive layer;

forming a cap layer on each exposed sidewall and each doping layer;

performing an annealing process on each doping layer to form a dopant region in the adjacent substrate, wherein each dopant region blocks leakage current resulting from a parasitic transistor adjacent to the trench and has a first distance from the surface of the substrate;

forming a second conductive layer in the trench to expose portions of the cap layers, wherein the second conductive layer contacts the first conductive layer and has substantially the same height with respect to the dopant regions;

removing portions of the cap layers exposed by the second conductive layer to reveal portions of the sidewalls in the upper portion of the trench; and forming a third conductive layer on the second conductive layer to fill the trench, wherein the third conductive layer directly contacts the exposed sidewalls in the upper portions of the trench.

2. The trench capacitor process as claimed in claim 1, wherein the substrate is a p-substrate.

3. The trench capacitor process as claimed in claim 1, wherein the dielectric layer is nitride material.

4. The trench capacitor process as claimed in claim 3, wherein the nitride material is silicon nitride.

5. The trench capacitor process as claimed in claim 1, wherein the buried plate is an n-doped region in the substrate adjacent to the lower portion of the trench.

6. The trench capacitor process as claimed in claim 1, wherein the first conductive layer, the second conductive layer and the third conductive layer are n-doped polysilicon.

7. The trench capacitor process as claimed in claim 6, wherein the n-doped polysilicon is arsenic-doped polysilicon.

8. The trench capacitor process as claimed in claim 1, wherein the doping layer is boro-silicate-glass (BSG).

9. The trench capacitor process as claimed in claim 1, wherein the cap layer is silicon dioxide.

10. The trench capacitor process as claimed in claim 1, wherein the doping region is vertically distributed in the substrate adjacent to the trench and approximately equidistant from the trench.

11. The trench capacitor process as claimed in claim 1, wherein the annealing process is furnace annealing or rapid thermal annealing (RTA).

12. The trench capacitor process as claimed in claim 1, wherein the charging conductivity of the dopants in the doping region is the same as in the substrate.

13. The trench capacitor process as claimed in claim 1, wherein the concentration of the dopants in the doping region is about double that in the substrate.

14. The trench capacitor process as claimed in claim 1, wherein the first distance is about 500~2500 Å.

15. A trench capacitor process for preventing parasitic leakage, capable of blocking leakage current resulting from a parasitic transistor adjacent to the trench, comprising the steps of:

conformably depositing a doping layer over the sidewalls of the trench;

forming a protective plug in the trench to expose a portion of the doping layer;

removing the portion of the doping layer exposed by the protective plug;

removing the protective plug to form a doping layer covering part of the sidewall of the trench;

forming a cap layer on the doping layer; and performing an annealing process on the doping layer and forming a dopant region in the substrate adjacent to the sidewall of the trench to block leakage current resulting from a parasitic transistor adjacent to the trench.

16. The trench capacitor process as claimed in claim 15, wherein the doping layer is boro-silicate-glass (BSG).

17. The trench capacitor process as claimed in claim 15, wherein the cap layer is silicon dioxide.

18. The trench capacitor process for preventing parasitic leakage as claimed in claim 15, wherein the charging conductivity of the dopants in the doping region is the same as that in the substrate.

19. The trench capacitor process as claimed in claim 15, wherein the concentration of the dopants in the doping region is about double that in the substrate.

20. The trench capacitor process as claimed in claim 15, wherein the dopant region does not contact the surface of the substrate and has a first distance therebetween.

21. The trench capacitor process as claimed in claim 20, wherein the first distance is about 500~2500 Å.

* * * * *